(12) United States Patent
Kaald

(10) Patent No.: US 8,593,318 B2
(45) Date of Patent: Nov. 26, 2013

(54) CONTINUOUS TIME ΔΣ ANALOG-TO-DIGITAL CONVERTER WITH A MITIGATION BIT SHIFTING MULTIPLEX ARRAY

(75) Inventor: Rune Kaald, Trondheim (NO)

(73) Assignee: Hittite Microwave Norway AS, Tiller (NO)

( * ) Notice: Subject to any disclaimer, the term of this patent is extended or adjusted under 35 U.S.C. 154(b) by 0 days.

(21) Appl. No.: 13/544,208

(22) Filed: Jul. 9, 2012

(65) Prior Publication Data

US 2013/0187804 A1 Jul. 25, 2013

Related U.S. Application Data

(60) Provisional application No. 61/632,244, filed on Jan. 20, 2012.

(51) Int. Cl.
*H03M 3/00* (2006.01)

(52) U.S. Cl.
USPC .......................................... 341/143; 341/155

(58) Field of Classification Search
USPC ........................... 341/143, 155, 156, 120, 118
See application file for complete search history.

(56) References Cited

U.S. PATENT DOCUMENTS 7,675,448 B1 * 3/2010 Huang et al. .................. 341/143

OTHER PUBLICATIONS

Xinpeng Xing et al. "A 40 MHz 12 bit 84.2dB-SFDR Continuous-Time Delta-Sigma Modulator in 90nm CMOS", IEEE Asian Solid-State Circuits Conference, Nov. 14-16, 2011, Jeju, Korea, pp. 249-252.
Matthew Park and Michael H. Perrott, "A 78 dB SNDR 87 mW 20 MHz Bandwidth Continuous-Time ΔΣ ADC With VCO-Based Integrator and Quantizer Implemented in 0.13 μm CMOS", IEEE Journal of Solid-State Circuits, vol. 44, No. 12, Dec. 2009, pp. 3344-3358.

* cited by examiner

*Primary Examiner* — Joseph Lauture
(74) *Attorney, Agent, or Firm* — Iandiorio Teska & Coleman, LLP

(57) ABSTRACT

A continuous time ΔΣ analog-to-digital converter with mitigation bit shifting multiplex array including a loop filter, a VCO responsive to analog signal configured to adjust the output frequency based on the magnitude of the analog signal and produce a digital output, a multi-stage phase quantizer responsive to the digital output configured to determine the phase of the VCO by comparing the phase of the VCO for a particular sample to a reference phase at said particular sample and generate a quantized phase difference value, and a multiplexer array coupled to the multi-stage phase quantizer configured to shift selected misaligned bits of the quantized phase difference value by a predetermined amount of bits to mitigate bit shifting of the multi-stage phase quantizer.

13 Claims, 4 Drawing Sheets

CONTINUOUS TIME ΔΣ ANALOG-TO-DIGITAL CONVERTER WITH A MITIGATION BIT SHIFTING MULTIPLEX ARRAY

RELATED APPLICATIONS

This application hereby claims the benefit of and priority to U.S. Provisional Application Ser. No. 61/632,244, filed on Jan. 20, 2012, under 35 U.S.C. §§119, 120, 363, 365, and 37 C.F.R. §1.55 and §1.78, which application is incorporated herein by reference.

FIELD OF THE INVENTION

This invention relates to a continuous time ΔΣ analog-to-digital converter (ADC) with a mitigation bit shifting multiplex array.

BACKGROUND OF THE INVENTION

Conventional continuous time ΔΣ ADCs typically include an analog filter response to an analog input signal and a low resolution clocked quantizer which provides a digital output. The output from the quantizer is input to digital-to-analog converters (DACs). The quantized signal from the DACs is fed back to the loop filter. The quantizer is typically clocked at a rate much higher than the bandwidth of the signal input to the loop filter. Conventional quantizers may include a Flash or SAR ADC. Because the quantizer is often clocked at a higher rate than the ADCs signal bandwidth, the quantizer consumes, depending on its resolution, a significant amount of power.

One solution to mitigate the power problem associated with using a conventional quantizer is to replace it with a VCO based quantizer, which leverages the phase of the VCO. However, using a VCO based quantizer instead of a conventional quantizer may result in bit shifting in the digital output. The bit shifting can affect the performance and accuracy of the DACs.

A typical conventional VCO phase quantizer includes a multi-stage VCO connected to a multi-stage phase quantizer. The multi-stage phase quantizer determines the phase of the VCO by comparing the phase of a VCO for a particular sample to a reference phase and generates a quantized phase difference value. However, a conventional VCO quantizer may also produce an output with shifted bits that can affect the performance and accuracy of the DACs.

Thus, there is a need for ΔΣ ADC which can mitigate bit shifting of a multi-stage phase quantizer.

SUMMARY OF THE INVENTION

In one aspect, a continuous time ΔΣ analog-to-digital converter with a mitigation bit shifting multiplex array is featured including a loop filter, a VCO responsive to analog signal configured to adjust the output frequency based on the magnitude of the analog signal and produce a digital output, a multi-stage phase quantizer responsive to the digital output configured to determine the phase of the VCO by comparing the phase of the VCO for a particular sample to a reference phase at the particular sample and generate a quantized phase difference value, and a multiplexer array coupled to the multi-stage phase quantizer configured to shift selected misaligned bits of the quantized phase difference value by a predetermined amount of bits to mitigate bit shifting of the multi-stage phase quantizer.

In one embodiment, the multi-stage phase quantizer may include a plurality of phase quantizers. The multiplexer array may include a plurality of multiplexers coupled to selected phase quantizers of the multi-stage phase quantizer. Selected multiplexers may each include two inputs and one output. The selected multiplexers may be coupled to selected phase quantizers and cross-coupled to different selected phase quantizers. The VCO, the multi-stage phase quantizer and the multiplexer array may include an even number of stages. The multi-stage phase quantizer and the multiplexer array may each include an odd number of stages. The multiplexer array may include a least one multiplexer having one input and one output. The at least one multiplexer may be coupled to a selected phase quantizer. The selected number of misaligned bits may correspond to half the number of stages of the multistage phase quantizer rounded up.

In one aspect, a method for mitigating bit shifting for a continuous time ΔΣ analog-to-digital converter is featured, the method includes the steps of: providing a loop filter, providing a VCO responsive to an analog signal, adjusting the output frequency based on the magnitude of the analog signal and producing a digital output, providing a multi-stage phase quantizer responsive to the digital output, determining the phase of the VCO by comparing the phase of the VCO for a particular sample to a reference sample at the particular sample, generating a quantized phase difference value, providing a multiplexer array coupled to the multi-stage phase quantizer, and shifting selected misaligned bits of the quantized phase difference value by a predetermined amount of bits to mitigate bit shifting of the multi-stage phase quantizer.

In one embodiment, the method may include the step of coupling selected multiplexers of the multiplex array to selected phase quantizers of the multi-stage phase quantizer and cross coupling the selected multiplexes to different phase quantizers. The method may include the step of shifting misaligned bits output by the multi-stage phase quantizer by half the number of stages of the multistage phase quantizer rounded up.

The subject invention, however, in other embodiments, need not achieve all these objectives and the claims hereof should not be limited to structures or methods capable of achieving these objectives.

BRIEF DESCRIPTION OF THE SEVERAL VIEWS OF THE DRAWINGS

Other objects, features and advantages will occur to those skilled in the art from the following description of a preferred embodiment and the accompanying drawings, in which.

DETAILED DESCRIPTION OF THE INVENTION

Figure 1:
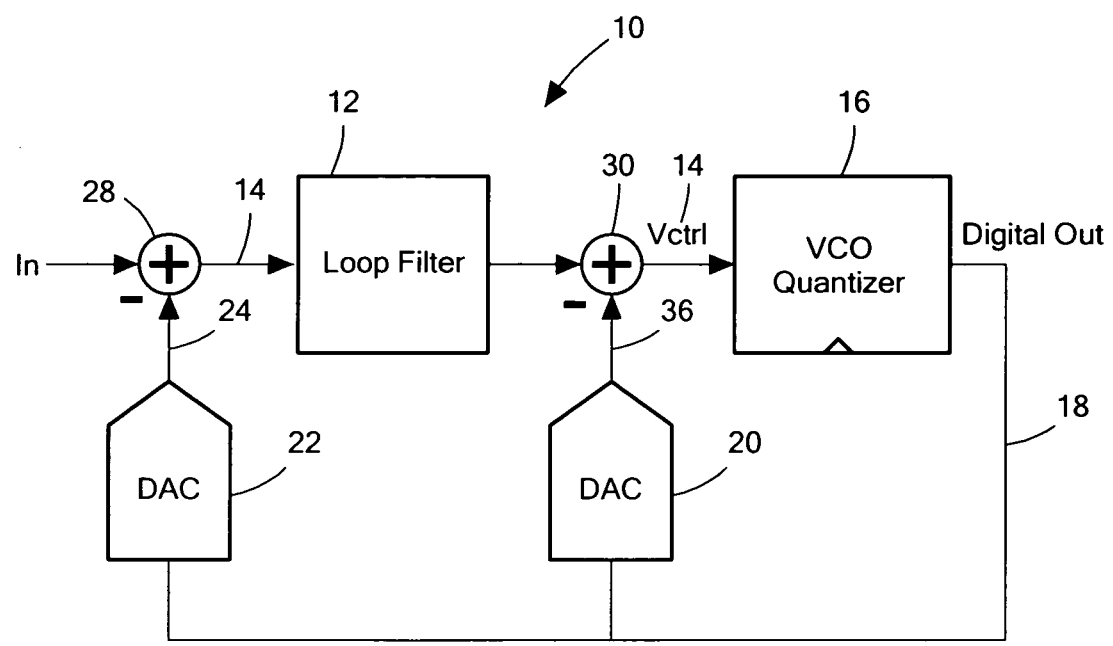
FIG. 1 is a schematic block diagram of a ΔΣ ADC with a VCO quantizer.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

Figure 2:
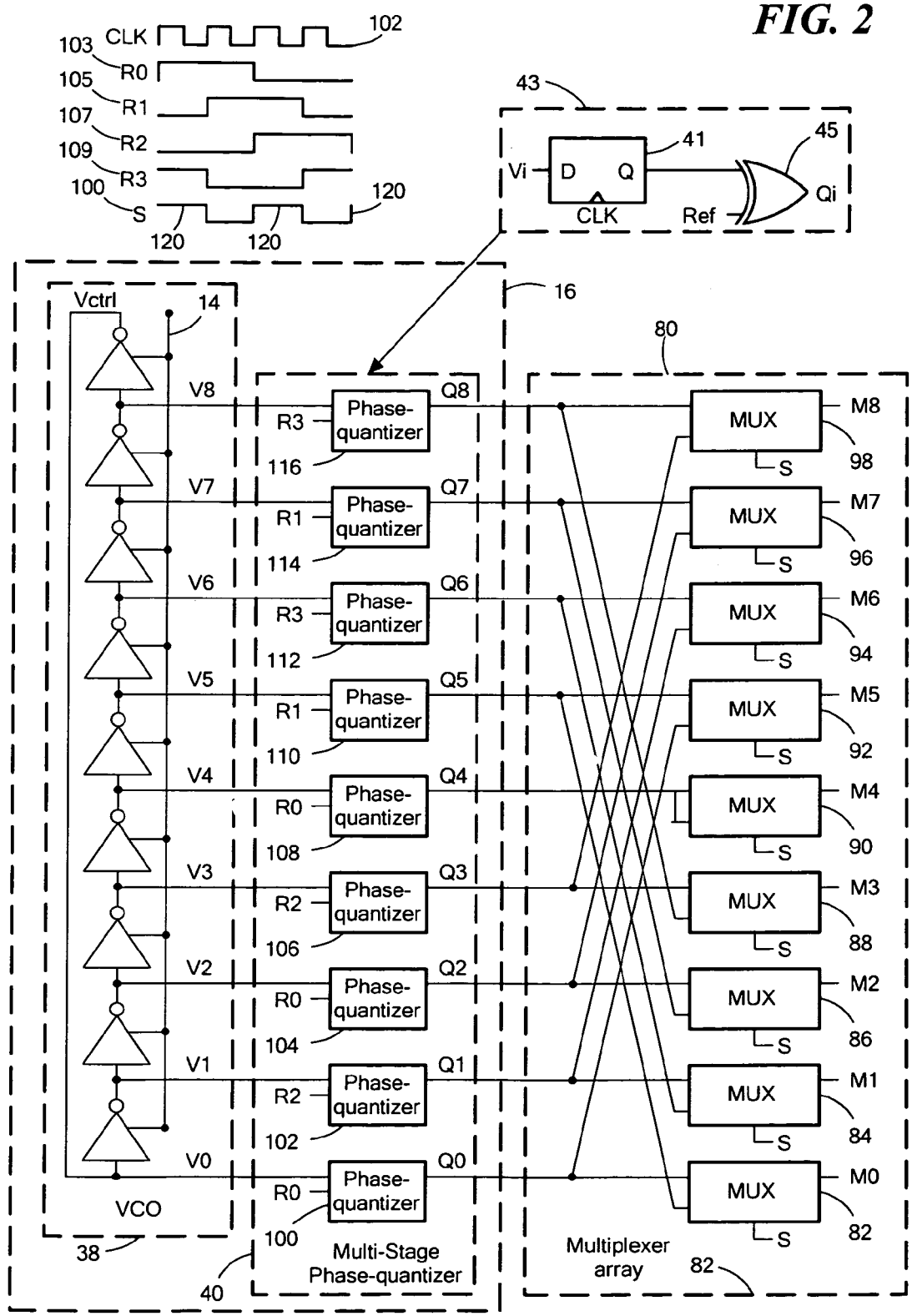
FIG. 2 is a schematic circuit diagram showing in further detail the continuous time ΔΣ ADC and VCO quantizer multiplex array system shown in FIG. 1 and one embodiment of the mitigating bit shifting multiplexer array of this invention.

Conventional continuous time ΔΣ ADC 10, FIG. 1, includes loop filter 12 responsive to an analog signal by line 14. The output from loop filter 12 is input into the control node, Vctrl 14, of VCO quantizer 16 such that the oscillation frequency of VCO quantizer 16 may be adjusted according to the input voltage level Vctrl 14 output by loop filter 12. During each clock cycle, each stage of the VCO quantizer 16 may be read preferably using sense amplifier based flip-flops, e.g., sense amplifier based flip-flop 41, FIG. 2, shown IN cut-out 43, or similar type digital logic. In this example, XOR port 45 coupled to flip-flop 41 which effectively checks if there is a difference between VCO phase and a reference phase, known as a phase comparison operation. When the phase of the VCO quantizer 16 is of interest, each quantized stage is then compared on a bit level to a reference phase operating on the VCO quantizer 16 desired nominal oscillation frequency. The digital output on line 18 of the VCO quantizer is fed back to DAC 20 and DAC 22. The output DAC 20 and DAC 22 is then added to the inputs and outputs of loop filter 12, indicated at 24 and 26, by summing circuits 28 and 30, respectively. However, as discussed in the Background section above, the output of VCO quantizer 16 may often result in unwanted bit shifting of the digital output on line 18 causing inaccuracies in the performance of DACs 20 and 22.

Figure 3A:
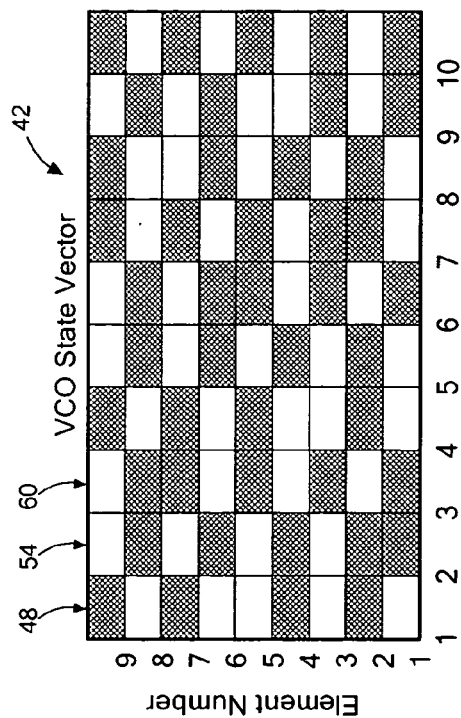
FIG. 3A is a plot depicting a VCO state vector for the system shown in FIG. 2.
Figure 3B:
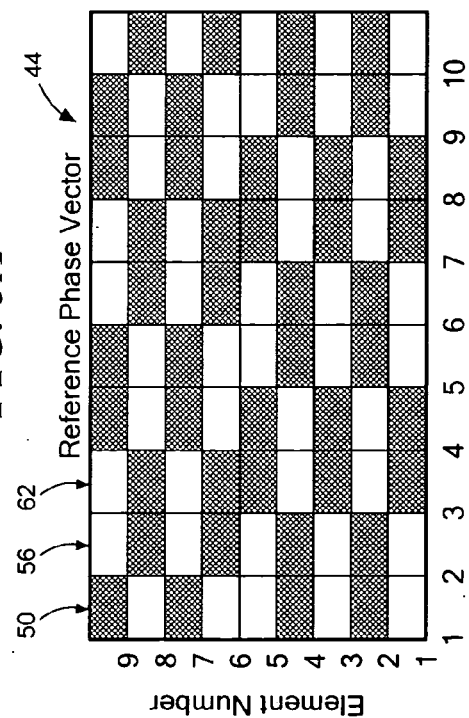
FIG. 3B is a plot showing a reference phase vector for the system shown in FIG. 2.
Figure 3C:
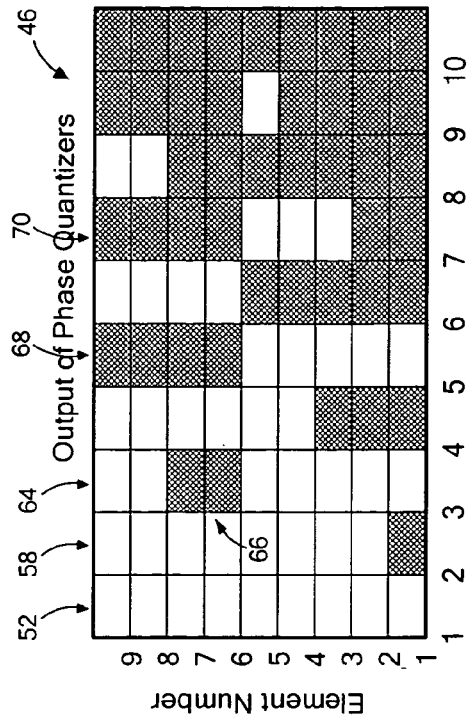
FIG. 3C is a plot showing the quantized values for the system shown in FIG. 2.

For example, VCO quantizer 16, FIG. 1, typically includes multi-stage VCO 38, FIG. 2, in this example a 9-stage VCO, where the output of each VCO stage is indicated by V0, V1, V2, V3, V4, V5, V6, V7, and V8. VCO quantizer 16 also includes multi-stage phase quantizer 40, in this example a 9 stage phase quantizer, with phase quantizers 100, 102, 104, 106, 108, 110, 112, 114, and 116, where the output of each stage is indicated by Q0, Q1, Q2, Q3, Q4, Q5, Q6, Q7, and Q8. In this example, when the frequency of the reference phase is equal to ¼ of the sampling rate of VCO read out logic 41, 45, FIG. 2, and DAC 20 and DAC 22, FIG. 1, the output of VCO quantizer 16, FIG. 2, will have unwanted bit shifting. This unwanted bit shifting is often referred to as not following a thermometer code. For example, plot 42, FIG. 3A, depicts an example of the VCO state vector for the output of each stage of multi-stage VCO 38, FIG. 2. Plot 44, FIG. 3B, shows a reference phase vector for each of phase quantizers 100-116 of phase quantizer 40, FIG. 2. VCO state vector plot 42, FIG. 3A, is compared against reference phase vector plot 44, FIG. 3B. That is, for each VCO state for each sample number shown in plot 42, FIG. 3A, the VCO state vector is subtracted from the reference phase vector, which produces the output shown by plot 46, FIG. 3C for each sample. For example, when each stage of sample 1 of VCO state vector plot 42, indicated at 48, is subtracted from each stage of sample 1 of reference phase vector plot 44, indicated at 50, the results are shown at 52 in output plot 46. Similarly, when each stage of sample 2 of VCO state vector plot 42, indicated at 54, is subtracted from each stage of sample 2 of reference phase vector plot 44, indicated at 56, the results are shown at 58, FIG. 3C, in output plot 46. For sample 3, when each stage of sample 3 of VCO state vector plot 42, FIG. 3A, indicated at 60, FIG. 3B, indicated at 62, is subtracted from each stage of sample 3 of reference phase vector plot 44, FIG. 3B, indicated at 62, the results are shown at 66, FIG. 3C, in output plot 46. As can be seen, the output bits of phase quantizer 40, FIG. 2, indicated at 66 FIG. 3C, are shifted by 5 bits. The process is repeated for each of the nine stages of phase quantizer 40. Similarly, the bits indicated at 68 and 70, FIG. 3C, have been shifted by 5 bits. As discussed in the Background section above, bit shifting can affect the performance and accuracy of the DAC 20 and DAC 22, FIG. 1.

To overcome the bit shifting problem associated with the bit shifting of phase quantizer 40, FIG. 2, bit mitigation bit shifting multiplexer array 80 of one embodiment of this invention is coupled to a multi-stage phase quantizer 40. Multiplexer array 80 is configured to shift selected misaligned bits output by phase quantizer 40 by a predetermined amount of bits to mitigate bit shifting, e.g., 5 bits. Mitigation bit shifting multiplexer array 80 includes a plurality of multiplexers (MUXs) each coupled to selected output of phase quantizers 100-116 of multi-stage phase quantizer 40. In this example, multiplexer array 80 includes an odd number of MUXs, e.g., 9 MUXs, namely, MUX 82, MUX 84, MUX 86, MUX 88, MUX 90, MUX 92, MUX 94, MUX 96, and MUX 98. In this example, each of MUXs 82, 84, 86, 88, 92, 94, 96, and 98 has two inputs from selected phase quantizers of phase quantizer 40 as shown and one output, M0, M1, M2, M3, M5, M6, M7, and M8, as shown. In this design, MUX 90 has only one input and one output. For example, MUX 82 has one input from output Q0 of phase quantizer 100 and one input from output Q5 of phase quantizer 110. MUX 84 has one input from output Q1 of phase quantizer 102 and one input from output Q6 of phase quantizer 112. MUX 86 has one input from output Q2 of phase quantizer 106 and one input from output Q7 of phase quantizer 114. MUX 88 has one input from output Q3 of phase quantizer 104 and one input from output Q8 of phase quantizer 116. MUX 90 has one only input from output Q4 of phase quantizer 108. MUX 92 has one input from output Q5 of phase quantizer 110 and one input from output Q0 of phase quantizer 100. MUX 94 has one input from output Q6 of phase quantizer 112 and one input from output Q1 of phase quantizer 102. MUX 96 has one input from output Q7 of phase quantizer 114 and one input from output Q2 of phase quantizer 104. MUX 98 has one input from output Q8 of phase quantizer 116 and one input from output Q3 of phase quantizer 106. Each of MUXs 82-98 is controlled by control signal S-100. As can be seen, control signal S-100 is high for 1 period of clock signal 102 and low for one period of clock signal 102. The inputs for phase quantizers 100-116 of phase quantizer 40 are indicated by R0, R1, R2, and R3 and the corresponding signals for the inputs are R0-103, R1-105, R2-105 and R3-109. Control signal S is designed to cause selected MUXs 86-90 to only operate when it has a high value, or logical 1, indicated at 120. Therefore, MUXs 86-90 only operate for every second sample. When active, because MUXs 82-88 are coupled to phase quantizers 100-106 and cross coupled to phase quantizers 110-116 and MUXs 92-98 are coupled to phase quantizers 110-116 and cross coupled to phase quantizers 100-106, multiplexer array 80 shifts the output of phase quantizer 40 by 5 bits or ½ the number of stages of VOO quantizer 16, rounded up (e.g., 9/2=4.5, rounded up to 5). For example, the unwanted bits that have been shifted by phase quantizer 40 indicated at 66, 68 and 70, FIG. 3C, in plot 46, have been shifted by multiplexer array 80 by 5 bits, as indicated at 130, 132, 134, FIG. 3D, in plot 122. The result is multiplexer array 80 has mitigated or corrected the unwanted bit shifting created by phase quantizer 40.

As discussed above, unwanted bit shifting is often referred to as not following a thermometer code. Thus, multiplexer array 80 effective provides a thermometer code output from phase quantizer 40 and may be beneficial for reducing power consumption of ΔΣ analog-to-digital converter 10, FIG. 1 and increase the dynamic performance of the feedback to DACs 20 and 22. One method of generating a thermometer code from a phase quantizer VCO 16, FIGS. 1 and 2 and to is now discussed.

Let Qi denote a particular phase quantizer element, e.g., one of phase quantizers 100-116, FIG. 2, and Nstages be the number of stages in the VCO quantizer 16, in this example, there are nine stages shown. For the first $$\frac{N_{stages}}{2}$$

phase quantizers 100-116, e.g., phase quantizers 100-106 the output of phase quantizers Qi and $$\left(Qi + \frac{N_{stages}}{2}\right)$$

are connected to a multiplexer number $$\left(i + \frac{N_{stages}}{2}\right).$$

Correspondingly, for the last $$\frac{N_{stages}}{2}$$

phase quantizers, e.g., phase quantizers 110-116, the outputs of phase quantizer element Qi and $$\left(Qi - \frac{N_{stages}}{2}\right)$$

are connected to the input of multiplexer number $$\left(i - \frac{N_{stages}}{2}\right).$$

When applying an alternating code, control signal S-100, to the select terminal of the multiplexers, the value from the four first phase quantizers 100-106 will be shifted upwards by an amount of five steps. Correspondingly, the four last phase quantizers 110-116 will be shifted downwards by an amount of five steps. When control signal S-100 is low, the outputs from the phase quantizers 100-116 will propagate through the multiplexers without any shifting. The results are discussed above with reference to FIGS. 3C and 3D.

Figure 3D:
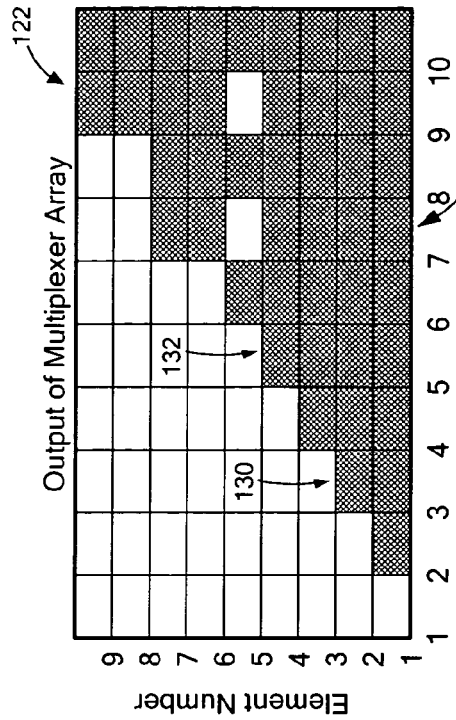
FIG. 3D is a plot showing the output of the mitigating bit shifting multiplexer shown in FIG. 2.

For a ring oscillator with an even number of stages, this method will produce an exact kind of thermometer code. In the case of an odd number of stages, as is shown in FIG. 2, the middle stage, phase quantizer 108, being the upward rounded number of $$\frac{N_{stages}}{2}$$

may not be swapped, since it has no corresponding reference phase image. The output codes in this case will not follow an exact thermometer type, e.g., as shown in FIG. 3D, but the midpoint will alternate. In practice, an implementation of VCO quantizer 16 may have at least 15 stages, such that the implication of the midpoint bit switching would be negligible with respected to the loss of performance associated with the feedback DACs. Correcting for the midpoint switching would require an increase of the logic depth and associated loop delay.

Figure 4C:
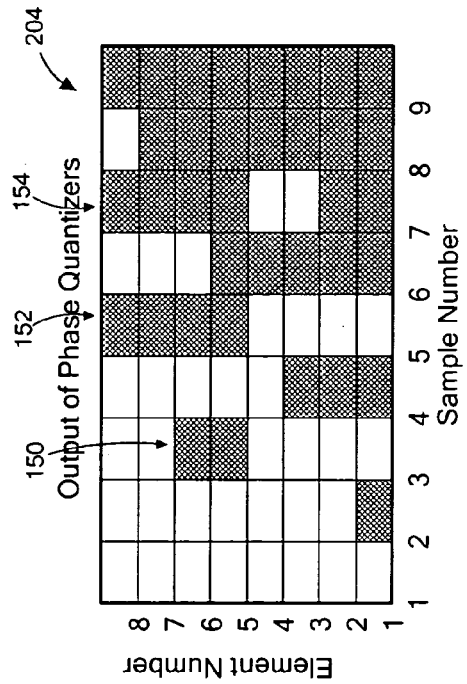
FIGS. 4A-4D are plots showing the reference phase vector, the VCO state vector, quantized values and output of the multiplexer array of another embodiment of this invention.
Figure 4D:
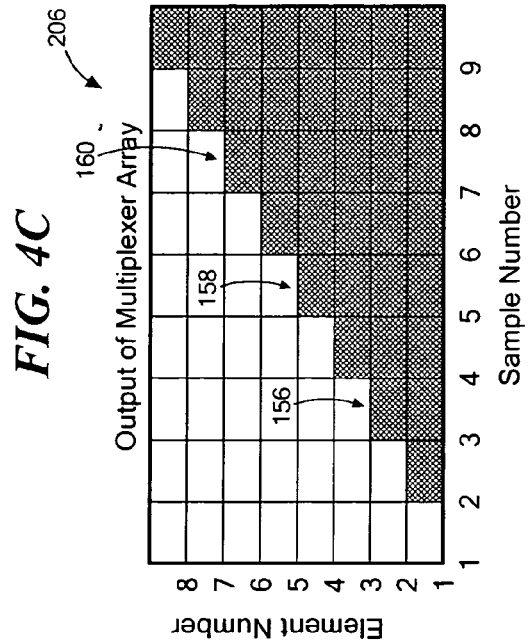
Figure 4A:
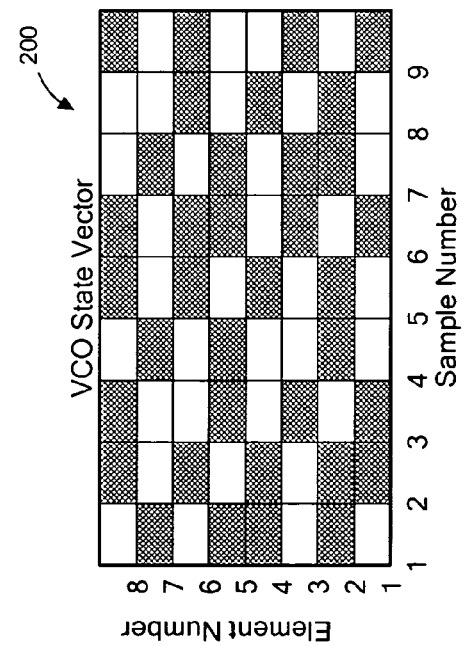
Figure 4B:
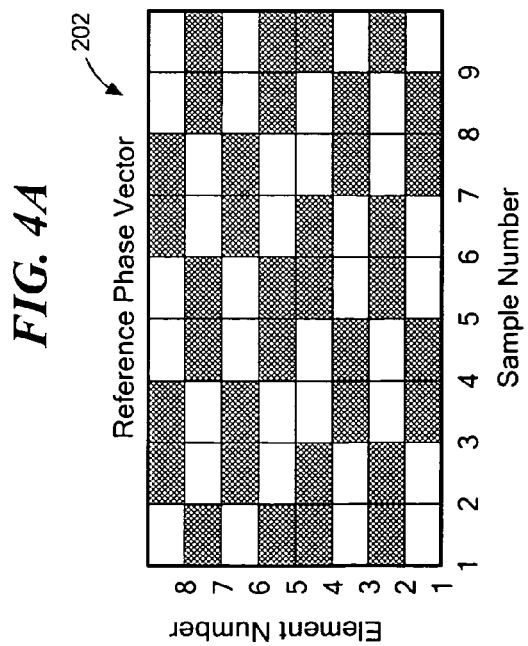

FIG. 5A shows a VCO state vector plot 200 for an even multi-stage VCO connected to a multi-stage phase quantizer and a multiplexer array 80 with an even number of MUXs. Plot 202, FIG. 4B shows a reference phase vector for the various reference inputs for each of the phase quantizers of phase quantizer 40 having an even number of stages and an multiplexer array 80 having an even number of stages. Plot 204 shows an example of the output of the phase quantizer 40 having an even number of stages with misaligned bits indicated at 150, 152, and 154. Plot 206 shows the output of multiplexer array 80 of one embodiment of this invention having an even number of stages wherein the bit shifting of phase quantizer 40 has been shifted by half the number of stages of VCO quantizer 16 using multiplexer array 80 of one embodiment of this invention, e.g., 8/2=4 bits, indicated at 156, 158, and 160 to effectively mitigate bit shifting of phase quantizer 40.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant cannot be expected to describe certain insubstantial substitutes for any claim element amended.

Other embodiments will occur to those skilled in the art and are within the following claims.

What is claimed is:
1. A continuous time ΔΣ analog-to-digital converter with a mitigation bit shifting multiplex array comprising:
a loop filter,
a VCO responsive to analog signal configured to adjust the output frequency based on the magnitude of the analog signal and produce a digital output;

a multi-stage phase quantizer responsive to the digital output configured to determine the phase of the VCO by comparing the phase of the VCO for a particular sample to a reference phase at the particular sample and generate a quantized phase difference value; and a multiplexer array coupled to the multi-stage phase quantizer configured to shift selected misaligned bits of the quantized phase difference value by a predetermined amount of bits to mitigate bit shifting of the multi-stage phase quantizer.

2. The $\Delta\Sigma$ analog-to-digital converter with a mitigation bit shifting multiplex array of claim 1 in which the multi-stage phase quantizer includes a plurality of phase quantizers.

3. The $\Delta\Sigma$ analog-to-digital converter with a mitigation bit shifting multiplex array of claim 2 in which the multiplexer array includes a plurality of multiplexers coupled to selected phase quantizers of the multi-stage phase quantizer.

4. The $\Delta\Sigma$ analog-to-digital converter with a mitigation bit shifting multiplex array of claim 1 in which the selected multiplexers each include two inputs and one output.

5. The $\Delta\Sigma$ analog-to-digital converter with a mitigation bit shifting multiplex array of claim 4 in which the selected multiplexers are coupled to selected phase quantizers and cross-coupled to different selected phase quantizers.

6. The $\Delta\Sigma$ analog-to-digital converter with a mitigation bit shifting multiplex array of claim 5 in which the VCO, the multi-stage phase quantizer and the multiplexer array includes an even number of stages.

7. The $\Delta\Sigma$ analog-to-digital converter with a mitigation bit shifting multiplex array of claim 6 in which the multiplexer array includes a least one multiplexer having one input and one output.

8. The $\Delta\Sigma$ analog-to-digital converter with a mitigation bit shifting multiplex array of claim 7 in which the at least one multiplexer is coupled to a selected phase quantizer.

9. The $\Delta\Sigma$ analog-to-digital converter with a mitigation bit shifting multiplex array of claim 5 in which the VCO, the multi-stage phase quantizer and the multiplexer array each include an odd number of stages.

10. The $\Delta\Sigma$ analog-to-digital converter with a mitigation bit shifting multiplex array of claim 1 in which the selected misaligned bits includes the number of bits corresponds to half the number of stages of the multistage phase quantizer rounded up.

11. A method for mitigating bit shifting for a continuous time $\Delta\Sigma$ analog-to-digital converter, the method comprising the steps of:

providing a loop filter;

providing a VCO responsive to an analog signal;

adjusting the output frequency based on the magnitude of the analog signal and producing a digital output;

providing a multi-stage phase quantizer responsive to the digital output;

determining the phase of the VCO by comparing the phase of the VCO for a particular sample to a reference sample at the particular sample;

generating a quantized phase difference value;

providing a multiplexer array coupled to the multi-stage phase quantizer; and shifting selected misaligned bits of the quantized phase difference value by a predetermined amount of bits to mitigate bit shifting of the multi-stage phase quantizer.

12. The method of claim 11 further including the step of coupling selected multiplexers of the multiplex array to selected phase quantizers of the multi-stage phase quantizer and cross coupling the selected multiplexes to different phase quantizers.

13. The method of claim 11 further including the step of shifting misaligned bits output by the multi-stage phase quantizer to be equal to half the number of stages of the multistage phase quantizer rounded up.

* * * * *